(12) United States Patent
Yamamoto et al.

(10) Patent No.: US 7,371,659 B1
(45) Date of Patent: May 13, 2008

(54) SUBSTRATE LASER MARKING

(75) Inventors: Haruhiko Yamamoto, Tsukuba (JP); Hideaki Seto, Tsukuba (JP); Nobuyoshi Sato, Tsuchiura (JP); Kyoko Kuroki, Tsukuba (JP)

(73) Assignee: LSI Logic Corporation, Milpitas, CA (US)

( * ) Notice: Subject to any disclaimer, the term of this patent is extended or adjusted under 35 U.S.C. 154(b) by 1208 days.

(21) Appl. No.: 10/020,764

(22) Filed: Dec. 12, 2001

(51) Int. Cl.
*H01L 21/76* (2006.01)

(52) U.S. Cl. ............... 438/444; 438/637; 257/E21.577

(58) Field of Classification Search ............... 257/712, 257/714, E21.577, E21.578; 438/444, 462, 438/439, 456, 445, 452, 33, 637, 640
See application file for complete search history.

(56) References Cited

U.S. PATENT DOCUMENTS 4,237,601 A * 12/1980 Woolhouse et al. ..... 438/444 X
5,621,746 A * 4/1997 Futasugi et al. .......... 438/33 X
6,642,477 B1 * 11/2003 Patel et al. ............. 219/121.71
6,747,216 B2 * 6/2004 Brist et al. .................. 174/262

* cited by examiner

*Primary Examiner*—Howard Weiss
*Assistant Examiner*—Hoa B Trinh
(74) *Attorney, Agent, or Firm*—Luedeka, Neely & Graham

(57) ABSTRACT

A method for forming a feature in a substrate, where residue within the feature can be easily removed. An upper sidewall portion of the feature is formed, where the upper sidewall portion forms a void in the substrate. The upper sidewall portion has an upper sidewall angle. A lower sidewall portion of the feature is formed, where the lower sidewall portion forms a void in the substrate. The lower sidewall portion has a lower sidewall angle. The upper sidewall angle of the upper sidewall portion is shallower than the lower sidewall angle of the lower sidewall portion. By forming the feature with a shallower sidewall angle at the top of the feature, any debris within the feature is more susceptible to rinsing, etching, or other cleaning procedures, and thus the feature is more easily cleaned than standard features having relatively steeper sidewalls.

14 Claims, 1 Drawing Sheet

SUBSTRATE LASER MARKING

FIELD

This invention relates to the fabrication of integrated circuits. More particularly, this invention relates to improving the yield of integrated circuits formed on substrates that are marked, such as with laser markings.

BACKGROUND

In the manufacture of integrated circuits, such as semiconductor devices, it is often desirable to form one or more features on the substrate, such as a semiconductor wafer substrate, for identification purposes. For example, in laser marking, laser radiation is used to partially melt and ablate a portion of the surface of the substrate to form a visible feature. These visible features, or indicia elements, are created in patterns to form identifying indicia.

The features generally have the structure of a blind bore or hole as shown in FIG. 1. Because of the shape of the feature, residue such as photoresist can remain in the feature, and the shape of the feature makes it difficult to completely remove the residue. The residue may, under subsequent processing conditions, eject from the feature and redeposit on nearby integrated circuits. Thus, the presence of the residue can adversely affect subsequent manufacturing steps and decrease the yield of integrated circuits on the substrate. As the geometries of integrated circuits continue to shrink, the detrimental effect of residue from laser marking tends to have an increasing impact on the yield.

Another shortcoming of conventional processes is their ability to render features of desirable configuration. For example, to enhance the visibility of the features, it is desirable that the cross sections of the features be substantially circular. Conventional methods may not yield features having such characteristics.

What is needed, therefore, is a method for forming features that have a shape that aids removal of residue from the features and which also renders features of more desirable configuration.

SUMMARY

The above and other needs are provided by a method for forming a feature in a substrate, where residue within the feature can be easily removed. An upper sidewall portion of the feature is formed, where the upper sidewall portion forms a void in the substrate. The upper sidewall portion has an upper sidewall angle. A lower sidewall portion of the feature is formed, where the lower sidewall portion forms a void in the substrate. The lower sidewall portion has a lower sidewall angle. The upper sidewall angle of the upper sidewall portion is shallower than the lower sidewall angle of the lower sidewall portion.

By forming the feature with a shallower sidewall angle at the top of the feature, any debris within the feature is more susceptible to rinsing, etching, or other cleaning procedures, and thus the feature is more easily cleaned than standard features having relatively steeper sidewalls.

In preferred embodiments of the invention, both the upper and the lower sidewalls are formed by laser ablation of the substrate. The upper sidewall angle of the upper sidewall is preferably between about thirty degrees and about sixty degrees, and the upper sidewall preferably has a depth of between about four microns and about eight microns. The lower sidewall angle of the lower sidewall is preferably between about sixty degrees and about ninety degrees, and the lower sidewall preferably has a depth of between about four microns and about eight microns. Most preferably the feature has a depth that is no more than about twelve microns.

In an alternate embodiment the invention provides identifying indicia on a substrate, where the identifying indicia are formed with a pattern of indicia elements. The indicia elements have a shape that aids in removal of foreign material from the indicia elements on the substrate. Each indicia element forms a blind bore in the substrate, and has a sidewall with a sidewall angle of between about thirty degrees and about sixty degrees. Each indicia element has a depth of no more than about twelve microns.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
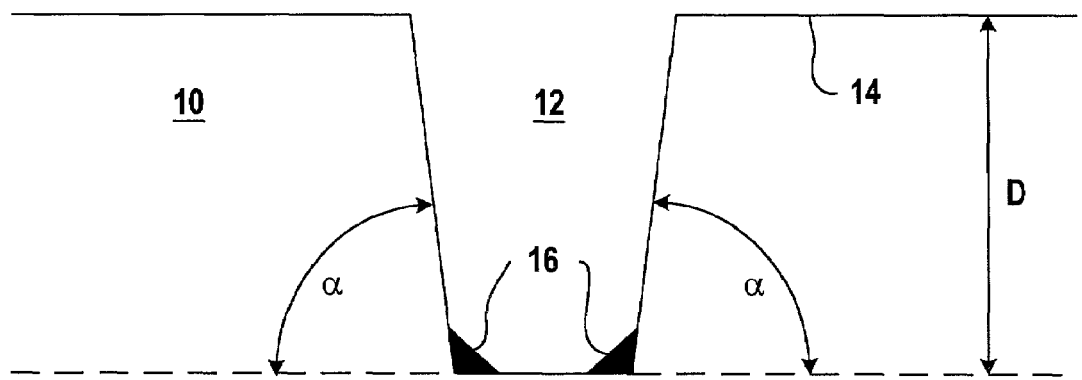
FIG. 1 is a cross sectional view of a prior art feature where the geometry of the feature makes it difficult to remove residue from the feature.

The invention enables the formation of identifying indicia having improved geometry as compared to conventional marking features. With reference to FIG. 1, there is represented a substrate 10, such as a silicon wafer, having a feature 12 formed as by laser radiation on the surface 14 of the substrate 10. Various additional layers, such as electrically conductive and electrically nonconductive layers typical to integrated circuit fabrication are applied over the substrate 10, and have features formed therein. Accordingly, as used herein, the term "substrate" refers not only to the base substrate 10, such as the silicon wafer, but to the entirety of any succeeding layers deposited thereon.

In the conventional structure depicted in FIG. 1, residue 16 easily collects in, and is difficult to remove from feature 12 due to the depth and relatively high aspect ratio of the feature 12. The depth and shape of the feature 12 make it difficult to remove the residue 16 from the feature 12. Conventional features 12 are typically formed in a single laser radiation step, and have wall angles α of at least about sixty degrees and a depth D of at least about twelve microns. With such a geometry, the residue 16 that remains in the bottom of the feature 12 becomes a potential source of contamination for the integrated circuits that are fabricated in close proximity to the feature 12. For example, during subsequent baking processes, the photoresist debris 16 may explode from the bottom of the feature 12 and redeposit on nearby integrated circuits, thus damaging the integrated circuits and lowering the yield of integrated circuits on the substrate.

Such features 12 are typically used to form identifying indicia on the surface of the substrate, and as such are formed on the substrate at or near the very beginning of substrate processing. Thus, there is ample opportunity for debris to collect within the feature 12, and redeposit at later times on the nearby integrated circuits.

Figure 2:
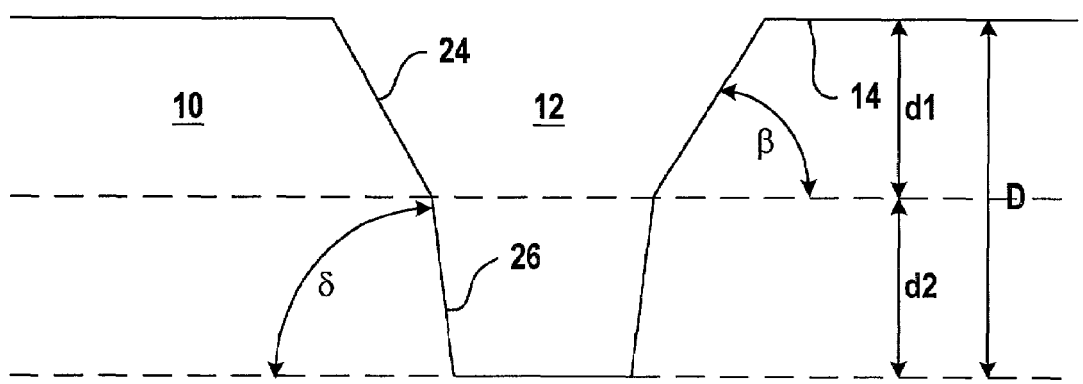
FIG. 2 is a cross sectional view of a feature formed according to a first embodiment of the invention.
Figure 3:
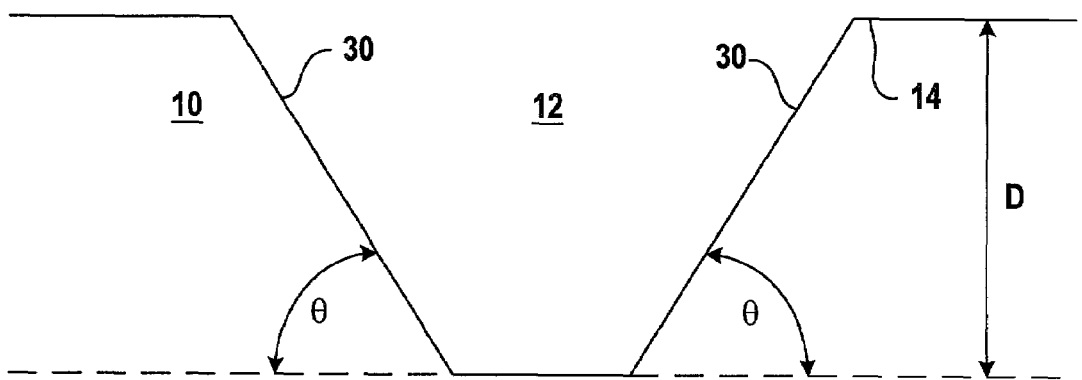
FIG. 3 is a cross sectional view of a feature formed according to a second embodiment of the invention.

The invention avoids undesirable marking geometries such as depicted in FIG. 1, and provides feature shapes that aid in the removal of the residue that may deposit in the bottom of the features. Accordingly, and with reference to FIG. 2, there is depicted a feature 12 formed in a substrate 10 in accordance with a first embodiment of the invention.

The feature 12, having an upper sidewall portion 24 adjacent a lower sidewall portion 26, is formed such as by laser radiation to provide a blind bore in the substrate 10. The upper sidewall portion 24 has an upper sidewall angle that is more shallow than that of the lower sidewall portion 26. In other words, the lower sidewall angle of the lower sidewall portion 26 is steeper than the upper sidewall angle of the upper sidewall portion 24. For example, the portion 24 preferably has an upper sidewall angle β of from about thirty degrees to about sixty degrees, and the portion 26 preferably has a lower sidewall angle δ of from about sixty degrees to about ninety degrees.

The depth d1 of the upper sidewall portion 24 is preferably from about four microns to about eight microns, and the depth d2 of the lower sidewall portion 26 is preferably from about four microns to about eight microns, with the combined depth of d1 and d2 preferably being less than about twelve microns.

In a second embodiment of the invention, the feature 12 has sidewalls 30 with an angle θ of from about thirty degrees to about sixty degrees. The depth d of the feature 12 is preferably no greater than about twelve microns. The feature 12 according to the present invention is preferably substantially circular in cross section so that the sidewalls are of substantially uniform slope.

Indicia elements 12 having the structure and made in accordance with the method described herein are less susceptible to retaining residue. As described previously, the presence of residue in the features 12 can adversely affect the fabrication process and significantly reduce yields. In addition, it is desired to provide features having substantially circular cross sections to enhance the visibility of the marks. It has been observed that forming the holes in accordance with the invention facilitates the forming of holes of substantially circular cross section as compared to prior art methods.

Thus, integrated circuits, such as semiconductor devices, processed in accordance with the methods as described above tend to have identifying indicia that are easier to remove residue from and which have superior visibility in the finished device. This results in improved integrated circuit quality and yield.

It is appreciated that the materials as described above, while providing an especially preferred application of the invention, are by way of example only, and that other materials that are compatible with the materials, structures, and processes of integrated circuit processing are also generally applicable to the invention as disclosed herein.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for forming a feature in a substrate, where residue within the feature can be easily removed, the method comprising the steps of:
   forming an upper sidewall portion of the feature by laser ablation, the upper sidewall portion forming a void in the substrate, where the upper sidewall portion has an upper sidewall angle, and
   forming a lower sidewall portion of the feature by laser ablation, the lower sidewall portion forming a void in the substrate, where the lower sidewall portion has a lower sidewall angle,
   where the upper sidewall angle of the upper sidewall portion is shallower than the lower sidewall angle of the lower sidewall portion.

2. The method of claim 1, wherein the upper sidewall angle of the upper sidewall portion is from about thirty degrees to about sixty degrees.

3. The method of claim 1, wherein the lower sidewall angle of the lower sidewall portion is from about sixty degrees to about ninety degrees.

4. The method of claim 1, wherein the lower sidewall portion is formed before the upper sidewall portion is formed.

5. The method of claim 1, wherein the feature comprises a blind bore formed in the substrate.

6. The method of claim 1, wherein the upper sidewall portion has a depth of between about four microns and about eight microns.

7. The method of claim 1, wherein the lower sidewall portion has a depth of between about four microns and about eight microns.

8. The method of claim 1, wherein the feature has a depth of no more than about twelve microns.

9. The method of claim 1, wherein the substrate comprises silicon.

10. A method for forming indicia elements on a substrate, where the indicia elements have a shape that aids in removal of foreign material from the indicia elements on the substrate, the method comprising the steps of:
   forming an upper sidewall portion of the indicia elements by laser ablation, the upper sidewall portion forming a void in the substrate, where the upper sidewall portion has an upper sidewall angle,
   forming a lower sidewall portion of the indicia elements by laser ablation, the lower sidewall portion forming a void in the substrate, where the lower sidewall portion has a lower sidewall angle,
   where the upper sidewall angle of the upper sidewall portion is shallower than the lower sidewall angle of the lower sidewall portion, and
   forming the indicia elements in a pattern to form identifying indicia on the substrate.

11. The method of claim 10, wherein all of the upper sidewall portions of all of the indicia elements are formed prior to forming any of the lower sidewall portions of any of the indicia elements.

12. The method of claim 10, wherein all of the lower sidewall portions of all of the indicia elements are formed prior to forming any of the upper sidewall portions of any of the indicia elements.

13. The method of claim 10, wherein a preceding one of the indicia elements is completely formed prior to forming a seceding one of the indicia elements.

14. The method of claim 10, wherein:

the upper sidewall angle of the upper sidewall portion is from about thirty degrees to about sixty degrees, the lower sidewall angle of the lower sidewall portion is from about sixty degrees to about ninety degrees, the upper sidewall portion has a depth of between about four microns and about eight microns, the lower sidewall portion has a depth of between about four microns and about eight microns, and the indicia element is a blind bore formed in the substrate and has a depth of no more than about twelve microns.

* * * * *